United States Patent
Spaeh

(10) Patent No.: US 10,104,791 B2
(45) Date of Patent: Oct. 16, 2018

(54) MODULAR ASSEMBLY

(71) Applicant: DIEHL AEROSPACE GMBH, Ueberlingen (DE)

(72) Inventor: Juergen Spaeh, Ueberlingen (DE)

(73) Assignee: DIEHL AEROSPACE GMBH, Ueberlingen (DE)

(*) Notice: Subject to any disclaimer, the term of this patent is extended or adjusted under 35 U.S.C. 154(b) by 0 days.

(21) Appl. No.: 15/501,612

(22) PCT Filed: Aug. 18, 2015

(86) PCT No.: PCT/EP2015/001692
§ 371 (c)(1),
(2) Date: Feb. 3, 2017

(87) PCT Pub. No.: WO2016/030005
PCT Pub. Date: Mar. 3, 2016

(65) Prior Publication Data
US 2017/0231104 A1 Aug. 10, 2017

(30) Foreign Application Priority Data
Aug. 28, 2014 (DE) .......... 10 2014 012 826

(51) Int. Cl.
*H05K 5/00* (2006.01)
*H05K 5/02* (2006.01)
(Continued)

(52) U.S. Cl.
CPC ......... *H05K 5/0047* (2013.01); *H05K 5/0021* (2013.01); *H05K 5/0213* (2013.01);
(Continued)

(58) Field of Classification Search
CPC ...... H05K 5/0247; H05K 5/03; H05K 7/1427; H05K 7/023; H05K 7/02; G06F 1/16
(Continued)

(56) References Cited

U.S. PATENT DOCUMENTS 5,181,167 A * 1/1993 Davidson ............... H05K 7/023
165/80.3
5,677,830 A * 10/1997 Nogas .................. H05K 5/0021
361/732

(Continued)

FOREIGN PATENT DOCUMENTS

GB 2298452 A 9/1996

OTHER PUBLICATIONS

International Search Report dated Oct. 21, 2015 issued in PCT/EP2015/001692.
(Continued)

*Primary Examiner* — Mandeep S Buttar
(74) *Attorney, Agent, or Firm* — Scully Scott Murphy and Presser; Frank DiGiglio

(57) ABSTRACT

The invention relates to a modular assembly that comprises at least two housing parts (1), in which in each case a circuit board (L) is received, at least one internal connecting means (17), one cover element and one closing element. Each housing part (1) is formed from a base plate (3), a rear wall (5) and side walls (4) that are connected to said rear wall. The housing parts (1) are stacked in such a manner that the side walls (4) combine to form a first (6) and a second complete side wall (7), and that the rear walls (5) combine to form a complete rear wall (8). At least two of the housing parts (1) are stacked in such a manner that the base plate (3) of the one housing part (1) is connected to the side walls (4) of the other housing part (1). The at least one internal connecting means (17) extends in a direction perpendicular to the base plates (3) and connects multiple circuit boards (L) by way of first connectors (18). The cover element lies on the side walls (4) of precisely one housing part (1). The closing element is attached to a front side on the housing
(Continued)

parts (1), said front side lying opposite the complete rear wall (8).

12 Claims, 11 Drawing Sheets

(51) Int. Cl.
| | |
|---|---|
| *H05K 5/03* | (2006.01) |
| *H05K 7/14* | (2006.01) |
| *H05K 7/20* | (2006.01) |
| *H05K 5/04* | (2006.01) |
| *H05K 7/02* | (2006.01) |

(52) U.S. Cl.
CPC ............ *H05K 5/0247* (2013.01); *H05K 5/03* (2013.01); *H05K 5/04* (2013.01); *H05K 7/023* (2013.01); *H05K 7/1427* (2013.01); *H05K 7/1435* (2013.01); *H05K 7/1451* (2013.01); *H05K 7/20336* (2013.01)

(58) Field of Classification Search
USPC ........ 361/700, 679.55, 679.56, 686; 362/382
See application file for complete search history.

(56) References Cited

U.S. PATENT DOCUMENTS

| | | | |
|---|---|---|---|
| 5,949,644 A * | 9/1999 | Park | G06F 3/033 361/679.32 |
| 6,104,611 A | 8/2000 | Glover et al. | |
| 7,099,151 B2 * | 8/2006 | Jones | G06F 1/16 361/679.02 |
| 7,656,671 B2 * | 2/2010 | Liu | G06F 1/185 361/735 |
| 2002/0044420 A1 | 4/2002 | Chen | |
| 2005/0135769 A1 * | 6/2005 | Makooi | G02B 6/3897 385/135 |
| 2006/0285289 A1 | 12/2006 | Jones et al. | |
| 2012/0243181 A1 | 9/2012 | Kisakuerek | |

OTHER PUBLICATIONS

"Rigid assembly takes cannon-launch g", Electronics Int., Aug. 18, 1977, pp. 50-52.

* cited by examiner

MODULAR ASSEMBLY

The invention relates to a modular assembly for receiving circuit boards.

In general, housings for receiving circuit boards are known from the prior art. Such housings are generally constructed from two housing parts. The number of circuit boards that are received is limited as a result of the size of the housing.

The object of the invention is to rectify the disadvantages of the prior art. In particular, a modular assembly is to be provided for receiving circuit boards and said assembly can be expanded to accommodate a greater number of circuit boards.

According to the invention, it is provided that the modular assembly comprises at least two housing parts in which in each case a circuit board is received, at least one internal connecting means, a cover element and a closing element, wherein each housing part is formed from a base plate, a rear wall and side walls that are connected to said rear wall. It is preferred that each housing part is embodied as a single-part from the base plate, the rear wall and the side walls that are connected to said rear wall.

According to the invention, it is furthermore provided that the housing parts are stacked in such a manner that the side walls combine to form a first and a second complete side wall and that the rear walls combine to form a complete rear wall. The first, second complete side wall and/or the complete rear wall preferably comprise in each case an essentially planar surface. The first, second complete side wall and/or the complete rear wall however can also comprise one or multiple steps and/or one or multiple openings in particular owing to base plates that are protruding or setback.

According to the invention, it is furthermore provided that at least two of the housing parts are stacked in such a manner that the base plate of the one housing part is connected to the side walls of the other housing part. It is preferred that the base plate of the one housing part is also connected to the rear wall of the other housing part. The base plate of the one housing part can lie on the side walls and/or on the rear wall of the other housing part. The base plate of the one housing part can be connected alternatively by means of spacers to the side walls and/or to the rear wall of the other housing part. For this purpose, the side walls and/or the rear wall of the other housing part can comprise spacers that in each case are connected to a holding apparatus that is provided on the base plate.

According to the invention, it is furthermore provided that the at least one internal connecting means extends in a direction perpendicular to the base plate and multiple circuit boards are connected by way of first connectors. For this purpose, one or multiple circuit boards and/or one or multiple base plates can comprise in each case a cut-out for feeding through at least the one internal connecting means. The cut-outs lie preferably in a row. The base plates and/or circuit boards can also in each case comprise multiple cut-outs for feeding through multiple internal connecting means. However, cut-outs can also be omitted in the base plates and/or in the circuit boards if the at least one internal connecting means is by way of example guided past a front wall that lies opposite the complete rear wall on the base plates or circuit boards. The internal connecting means can be fixedly connected to the circuit boards, by way of example by means of soldered contacts or can be connected in a detachable manner to the circuit boards by way of example by means of plug connections. The internal connecting means can be by way of example a cable, a further circuit board or an optical connection. The further circuit board can be embodied in a rigid or flexible manner. The use of a further circuit board that connects multiple circuit boards as an internal connecting means is particularly advantageous, because as a consequence the number of plug connections that is required is reduced. As a consequence, additional transition resistances or voltage drops are avoided.

According to the invention, it is furthermore provided that the cover element lies on the side walls of precisely one housing part. It is preferred that the cover element also lies on the rear wall of the precisely one housing part.

According to the invention, it is furthermore provided that the closing element is attached to a front side on the housing parts, said front side lying opposite the complete rear wall. The closing element is preferably a closing plate that covers the front side. The closing plate is preferably produced from metal. Sockets can be provided on the closing plate for connecting external devices, wherein each socket is connected in each case to one of the circuit boards. As a consequence, a cuboid-shaped modular assembly can be provided whose six sides are essentially closed by means of the formation of walls.

The modular assembly can be expanded in a simple manner by means of adding further housing parts in order to be able to receive a greater number of circuit boards. The modular construction makes the modular assembly particularly cost-effective.

According to one advantageous embodiment, it is provided that the cover element is a cover plate that is essentially parallel to the base plate. It is preferred that the cover plate also lies on the rear wall of the precisely one housing part. Furthermore, the cover plate is preferably embodied from metal.

According to an alternative advantageous embodiment, it is provided that the cover element comprises one or multiple housing parts and that the precisely one housing part and precisely one other housing part that is encompassed by the cover element are stacked in such a manner that the side walls of the precisely one housing part lie on the side walls of the other housing part without one of the base plates of these two housing parts being located between said sidewalls. It is preferred that the rear wall of the precisely one housing part also lies on the rear wall of the other housing part. It is possible by means of this type of stacking arrangement to provide a cuboid-shaped modular assembly having six walled sides without having to provide a cover plate that would be parallel to the base plates.

According to a further advantageous embodiment, it is provided that the circuit board that is received in the precisely one housing part and the circuit board that is received in the other housing part comprise in each case at least one processor and are connected directly to one another by means of at least one processor connecting means. For this purpose, in each case a plugging element is preferably soldered to the two circuit boards. The two plugging elements are preferably plugged directly into one another so as to form the processor connecting means. Expediently, the plugging elements are located in each case in the immediate vicinity of one of the processors. In this manner, it is possible to operate two processor-connected computers in one housing. By way of example, two plugging elements can also be provided on each of the two circuit boards that are to be plugged into one another as pairs.

According to a further advantageous embodiment, it is provided that at least one base plate is thermally connected by means of at least one heat pipe to a further base plate. It is preferred that at least one inner-lying base plate is thermally connected by means of at least one heat pipe to a further outer-lying base plate, particularly preferably to an outer surface of the base plate that forms the modular assembly. In addition, the inner-lying base plate can comprise solid metal bodies in the immediate vicinity of heat-generating components that are located on adjacent circuit boards. The term "adjacent circuit boards" is understood to mean both the circuit board that is received by the housing part that comprises the inner-lying base plate as well as the circuit board that is located on the other side of the inner-lying base plate and that is received by another housing part. The latter mentioned circuit board has in other words on each of its two sides in each case one adjacent base plate. It is therefore possible to dissipate heat from each of the two sides of this circuit board to the in each case adjacent base plate. It is preferred for this purpose that in each case solid metal bodies extend from the respective base plate to the heat-generating component on the circuit board. It is preferred that the solid metal bodies in each case are in direct thermal contact with a heat pipe. By virtue of providing the solid metal bodies and/or heat pipes, it is rendered possible to effectively dissipate heat from the inner-lying circuit board to the outside.

According to a further advantageous embodiment, it is provided that the side walls of at least one housing part comprise openings for forming at least one air duct. Air that flows through the ventilating duct can flow around the circuit board that is received by the housing part and thereby dissipate heat from the components that are provided on said circuit board. Alternatively or in addition thereto, the ventilating duct can also be embodied in such a manner that the air that flows through the ventilating duct flows around a base plate that is adjacent to the circuit board or can merely flow past the surface of the adjacent base plate that is remote from or adjacent to the circuit board. The surface of the adjacent base plate that is remote from or facing the circuit board can also comprise a stud structure or a rib structure. As a consequence, the surface of the adjacent base plate that is remote from or facing the circuit board comprises a larger effective surface and can thereby better dissipate heat. The ventilation can be active or passive. In particular, the ventilation can utilize the chimney effect.

Expediently, the housing parts are produced from metal. Such housing parts are characterized by virtue of an effective conductivity of heat and a good shielding from electromagnetic fields. In particular, metal base plates can separate the various circuit boards and shield said circuit boards from one another.

According to a further advantageous embodiment, it is provided that the closing element is a closing housing. The closing housing is preferably produced from metal.

The closing housing is preferably itself constructed in a modular manner.

According to a further advantageous embodiment, it is provided that at least one circuit board extends into the closing housing.

According to a further advantageous embodiment, it is provided that an expansion plate is attached to at least one circuit board, said expansion plate being located in the closing housing. It is possible by means of providing the closing housing and by means of using expansion plates to expand the modular assembly to new functions in a particularly simple and rapid manner.

According to a further advantageous embodiment, it is provided that a recess is provided between the circuit board and the expansion plate for feeding through at least one of the internal connecting means, wherein the at least one of the internal connecting means is connected by way of first connectors to multiple circuit boards or to multiple expansion plates or to both at least one circuit board as well as also at least one expansion plate. Expediently, the recess aligns with at least one further recess and/or at least one cut-out that is provided in the further circuit board. As a consequence, it is possible to provide connections between multiple circuit boards and/or expansion plates that are received in the modular assembly.

According to a further advantageous embodiment, it is provided that two connectors are provided for external connections on an outer side of the closing housing. The second connectors are preferably plugging elements such as fitted plugs and/or sockets. As a consequence, it is possible in a particularly simple manner to connect external devices and/or a current supply to the modular assembly.

According to a further advantageous embodiment, it is provided that third connectors for at least one external connecting means between multiple circuit boards or multiple expansion plates or both at least one circuit board as well as at least one expansion plate are provided on an outer side of the closing housing. The third connectors are preferably plugging places and/or pin strips. As a consequence, it is possible in a particularly simple manner to produce connections between multiple circuit boards and/or expansion plates that are received in the modular assembly.

According to a further advantageous embodiment, it is provided that the internal and/or external connecting means are achieved by means of cable, further circuit boards and/or optical connections. The cables can be connected by way of plug connections to the circuit boards and/or expansion plates. For this purpose, plugs and sockets that correspond to the circuit boards or expansion plates can be provided on the cables. In particular, cables that are provided as internal connecting means can also be soldered directly to the circuit boards and/or expansion plates.

According to a further advantageous embodiment, it is provided that the internal and/or external connecting means transfer signals and/or current. It is possible by means of the connecting means to provide by way of example wired OR functions or signal routing functions.

It is preferred that when stacked the housing parts engage into one another in a positive-locking manner. The housing parts can be embodied for this purpose in such a manner that when stacked the side walls and/or the rear wall of the one housing part engage in a positive-locking manner into a stepping arrangement that is provided on the other housing part. Alternatively or in addition thereto, a stepping arrangement can be provided on the engaging side wall and/or on the engaging rear wall. It is possible by virtue of these measures to provide a stable stacking arrangement of the housing parts.

Furthermore, it is preferred that each circuit board is fastened by means of at least one screw connection to the housing part that receives said circuit board. The individual housing parts are preferably likewise fastened to one another by means of at least one screw connection.

Furthermore, the rear walls of the housing parts in each case comprise a profile of this type so that the complete rear wall of the modular assembly and the complete rear wall of a further modular assembly that is rotated about 180° in relation to an axis that extends in the stacking direction engage into one another in a positive-locking manner. A double assembly is formed in this manner. Alternatively or in addition thereto, fastening means can be provided in the region of the rear wall so as to provide the rear wall with a profile so as to form the double assembly.

Preferred exemplary embodiments of the invention are further explained hereinunder with reference to drawings. In the drawings.

Figure 5A:
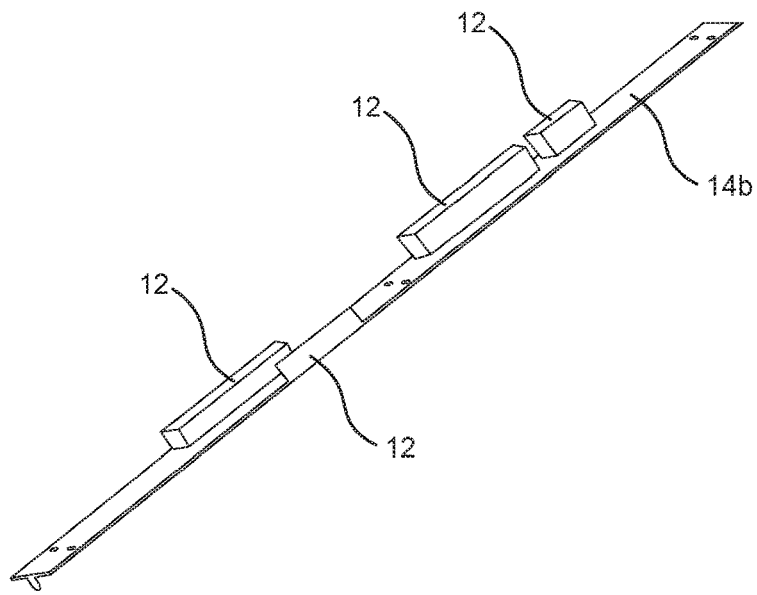
FIG. 5A illustrates a schematic perspective view of a cover.
Figure 5B:
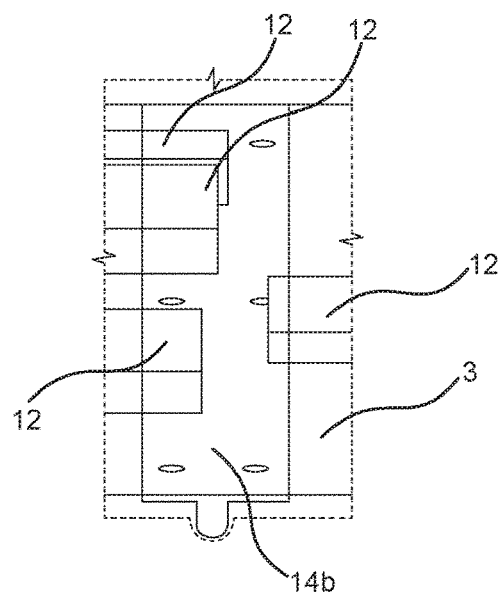
Figure 6:
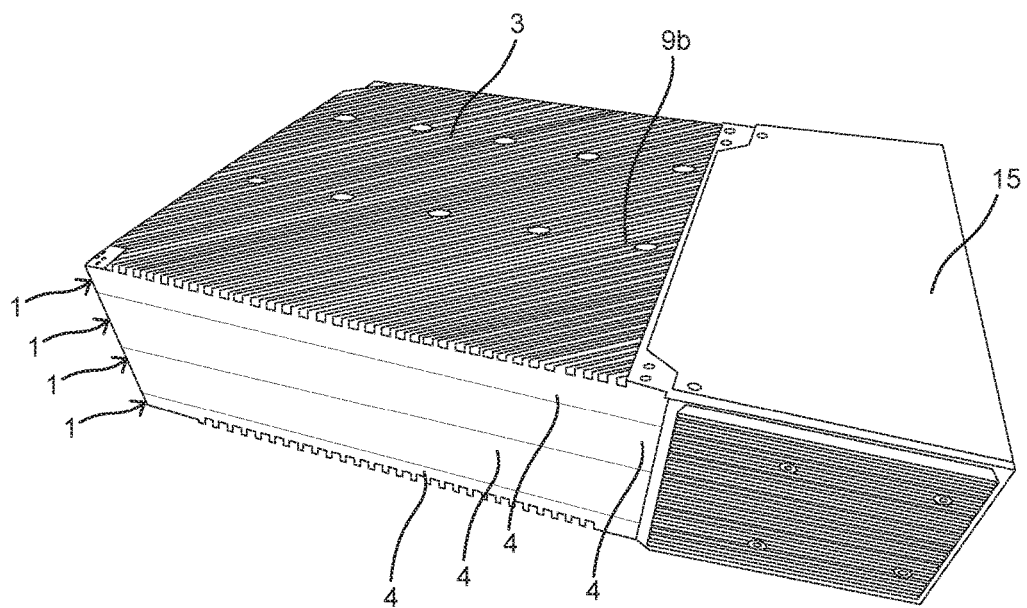
Figure 7A:
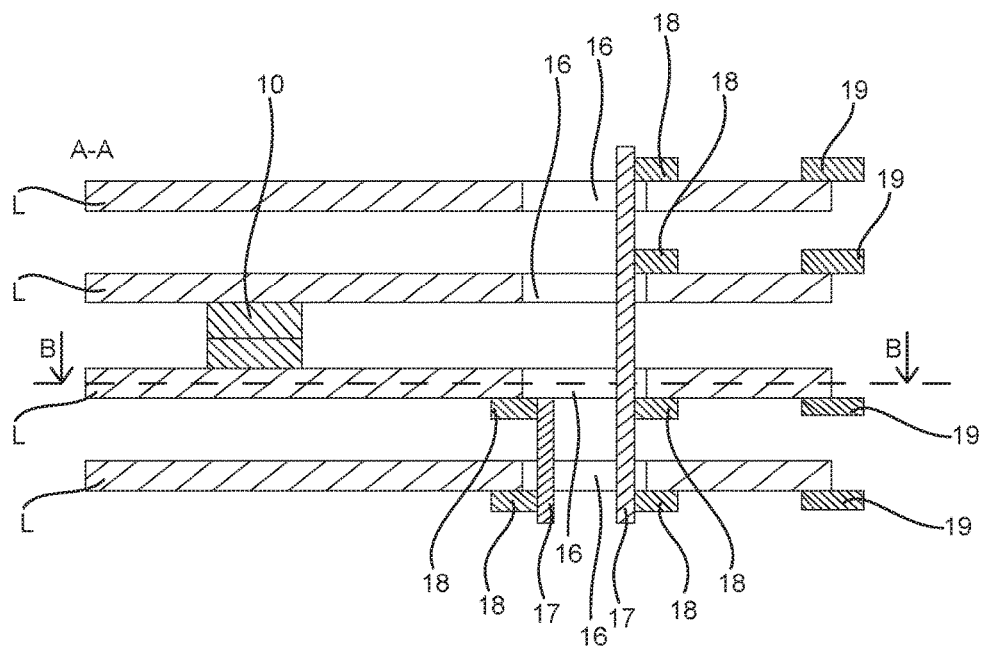
Figure 7B:
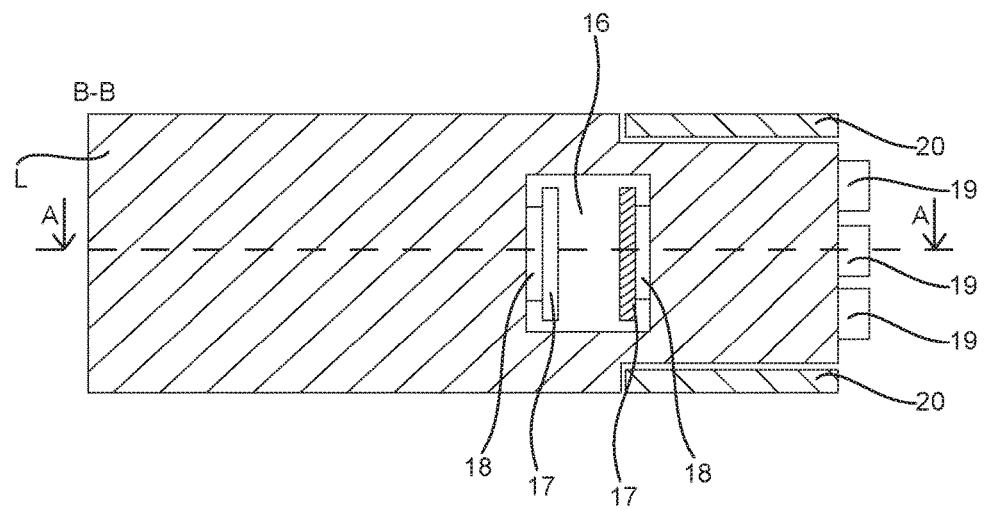
Figure 7C:
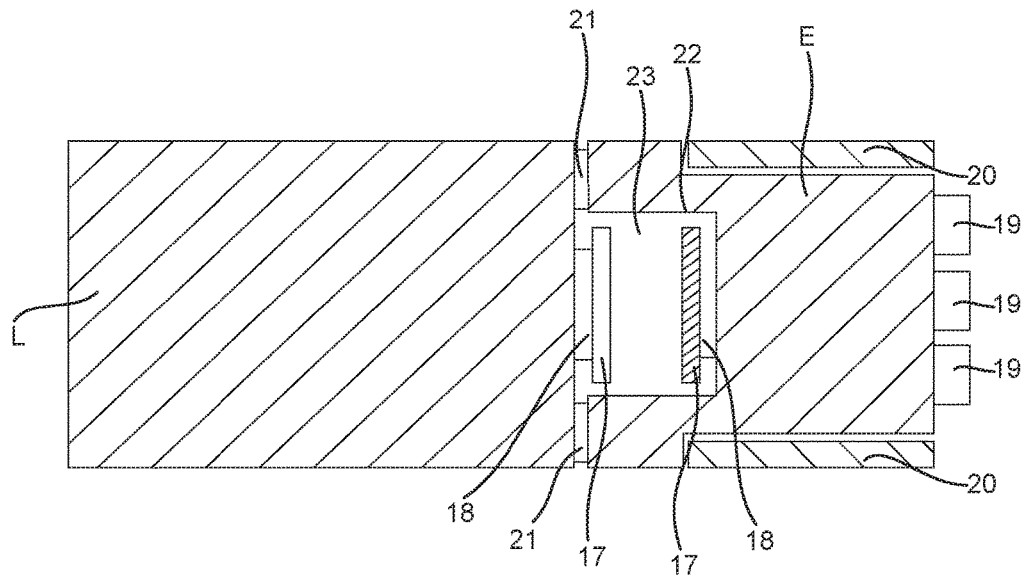
Figure 7D:
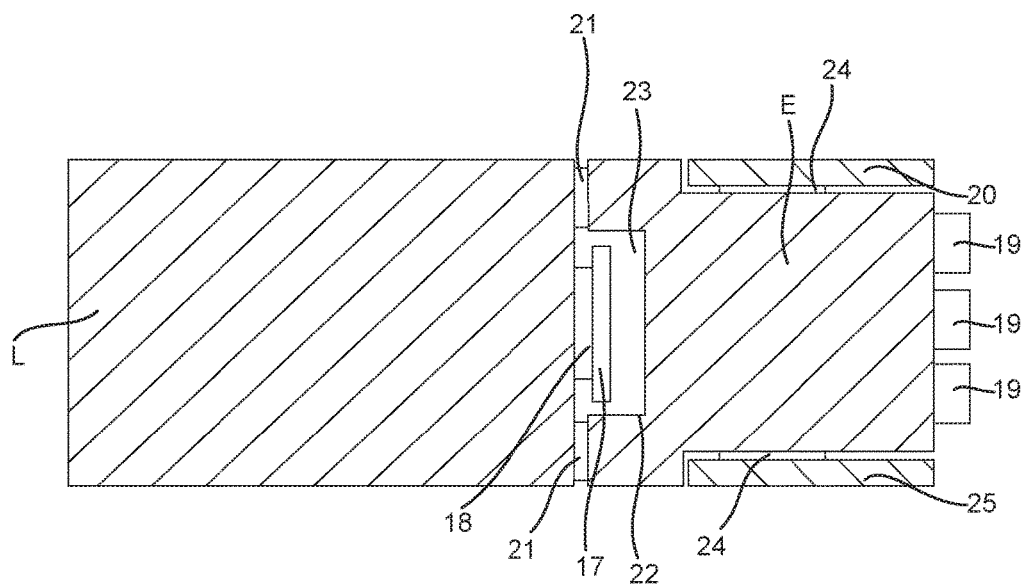
Figure 8:
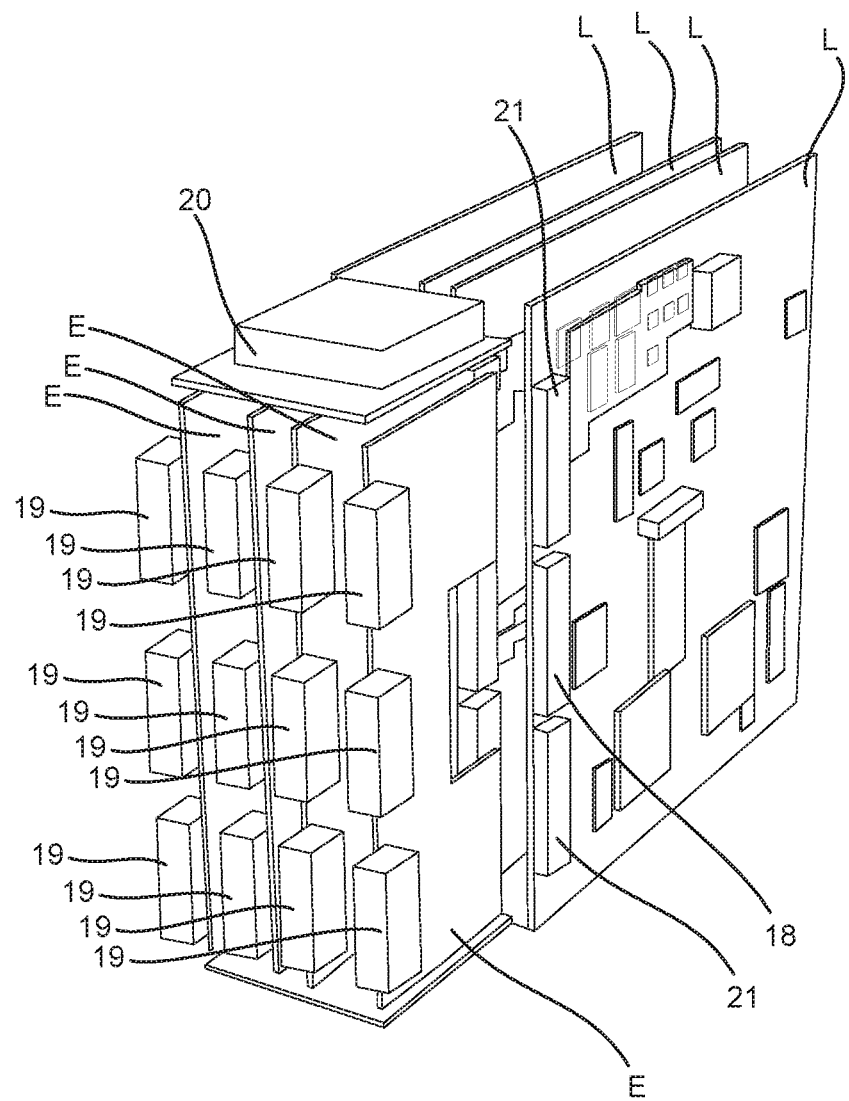
Figure 9A:
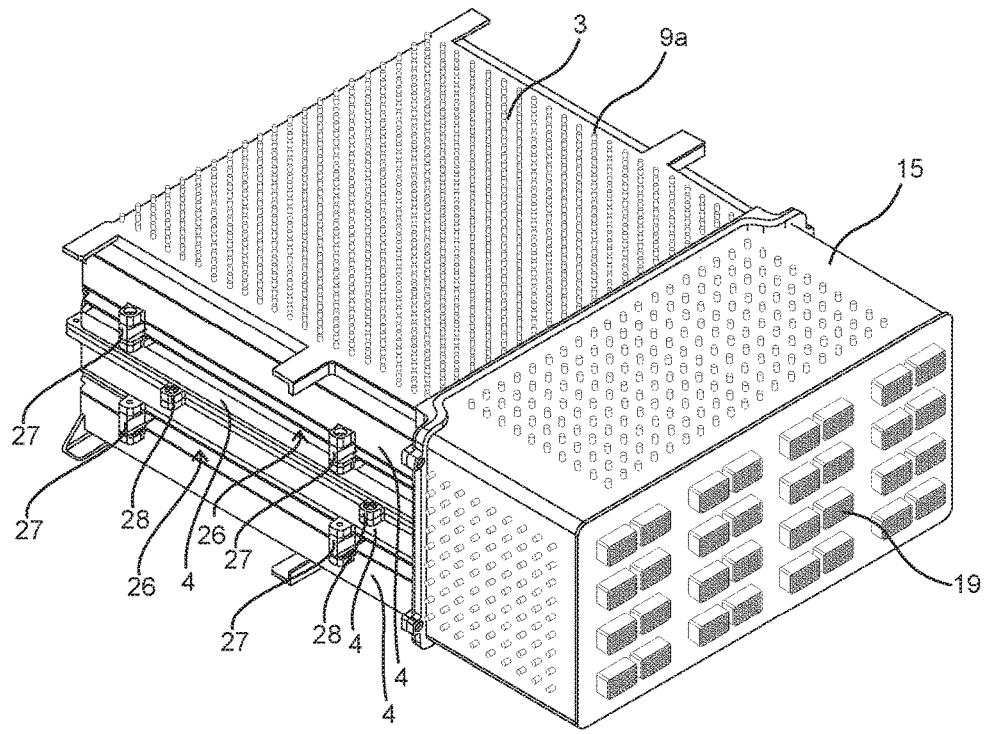

FIG. 5B illustrates a schematic sectional view of a housing part having an inserted cover, FIG. 6 illustrates a perspective view of a third modular assembly that comprises a closing housing, FIGS. 7A-D illustrate schematically the third modular assembly, FIG. 8 illustrates a schematic perspective view into the third modular assembly, FIGS. 9A, B illustrate a perspective side view and also a side view of a fourth modular assembly that comprises a closing housing, and FIGS. 10A-D illustrate schematic sectional views of multiple exemplary embodiments.

Figure 1:
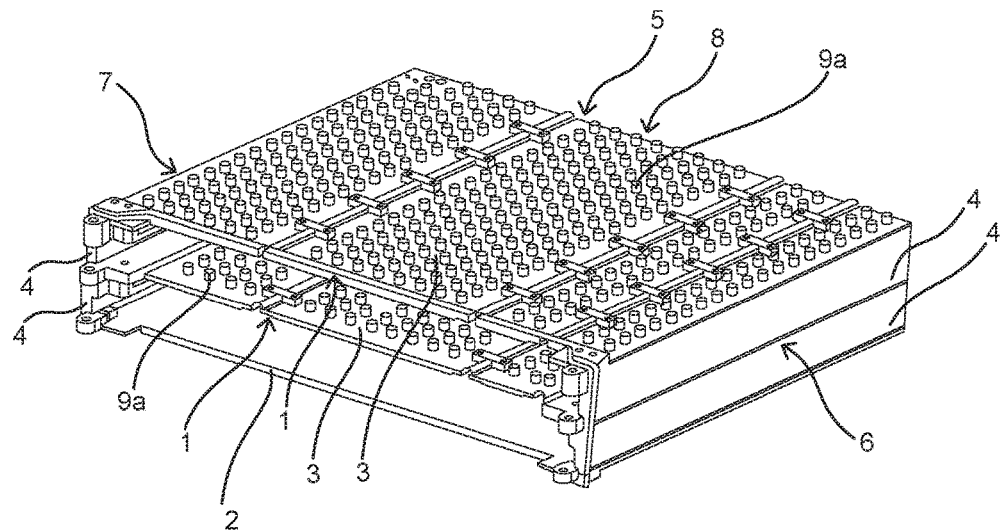
FIG. 1 illustrates a perspective view of a first modular assembly.

FIG. 1 illustrates a perspective view of a first modular assembly, wherein in this case the circuit boards are left out. The first modular assembly is formed from two housing parts 1 and a cover plate 2. Each of the two housing parts 1 comprises a base plate 3, two side walls 4 and a rear wall 5. The side walls 4 and the rear wall 5 extend in each case from the base plate 3 in the direction of the cover plate 2. The rear wall 5 is obscured in the present view. Each of the two housing parts 1 is embodied so as to receive a circuit board. The two housing parts 1 are stacked in a stack one on top of the other in the same alignment. The side walls 4 form a first 6 and an opposite-lying second complete side wall 7. The rear walls 5 form a complete rear wall 8 (obscured in this view). The first 6 and the second complete side wall 7 and also the complete rear wall 8 form in each case an essentially planar outer surface. The stack is closed by means of the cover plate 2. Each of the two housing parts 1 comprise studs 9a on an outer side of the base plate 3 that is remote from the cover plate 2. In general, in each case the side that is remote from the circuit board that is received is understood as the "outer side of a base plate 3". Accordingly, in each case the side that is facing the circuit board that is received is understood as the "inner side of the base plate 3". The studs 9a enlarge the effective surface and thereby facilitate the dissipation of heat.

Figure 2:
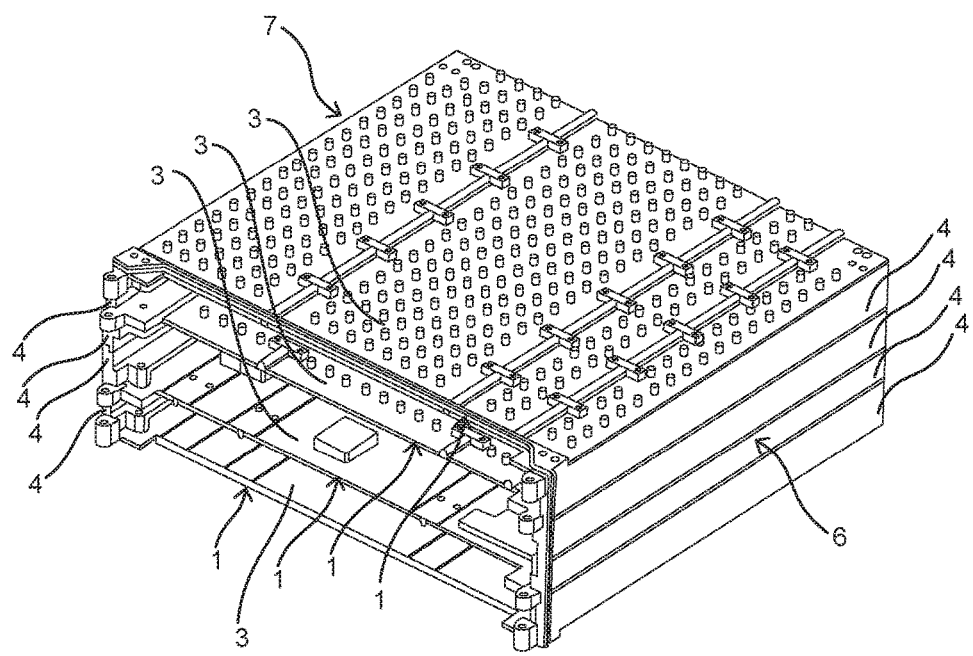
FIG. 2 illustrates a perspective view of a second modular assembly.

FIG. 2 illustrates a perspective view of a second modular assembly, wherein the circuit boards are in turn omitted. The second modular assembly is formed from four housing parts 1. Each of the four housing parts 1 is embodied so as to receive a circuit board. The second modular assembly does not comprise a cover plate 2. The housing parts 1 are stacked one on top of the other in such a manner that the two upper housing parts 1 are orientated in a like manner and also the two lower housing parts 1 are orientated in a like manner. However, the two upper housing parts 1 are orientated in each case in an opposing manner with respect to the two lower housing parts 1. As a consequence, a space is formed between the upper and the lower housing parts 1 for receiving two circuit boards.

Figure 3:
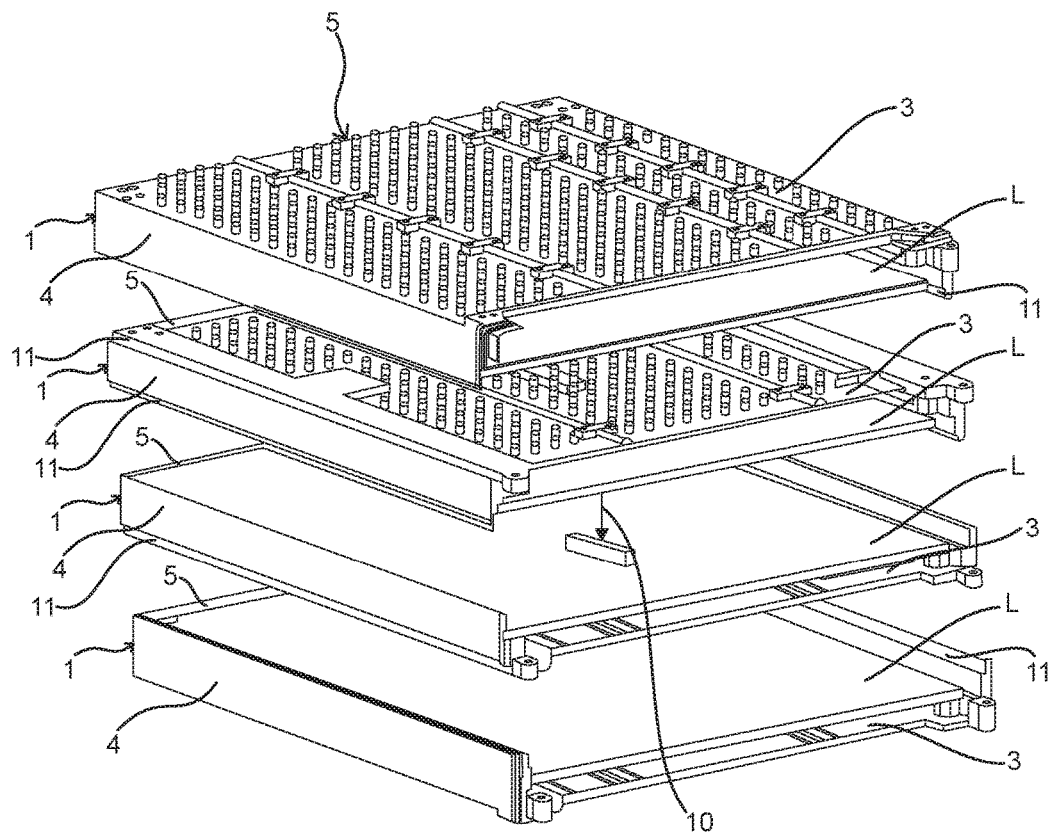
FIG. 3 illustrates an exploded view of the second modular assembly.

FIG. 3 illustrates an exploded view of the second modular assembly. In FIG. 3, the circuit boards are illustrated and provided with the reference numeral L. There is no base plate 3 between the two center circuit boards L. The two center circuit boards L comprise on their sides that are facing one another in each case a processor. A plugging element is allocated in each case to the two processors. As is indicated by means of the arrow, the two plugging elements plug directly into one another so as to produce a processor connecting means 10. The two in each case outer circuit boards L can be interface cards. In the case of the exploded view illustrated in FIG. 3, it is also evident that the housing parts 1 comprise stepping arrangements 11 in an edge region of the base plate 3 and/or on a longitudinal edge of the side walls 4. When stacked, the housing parts 1 engage into one another in a positive-locking manner owing to the stepping arrangements 11. It is possible by means of providing the stepping arrangements 11 to provide a stable stacking arrangement of the housing parts 1.

Figure 4A:
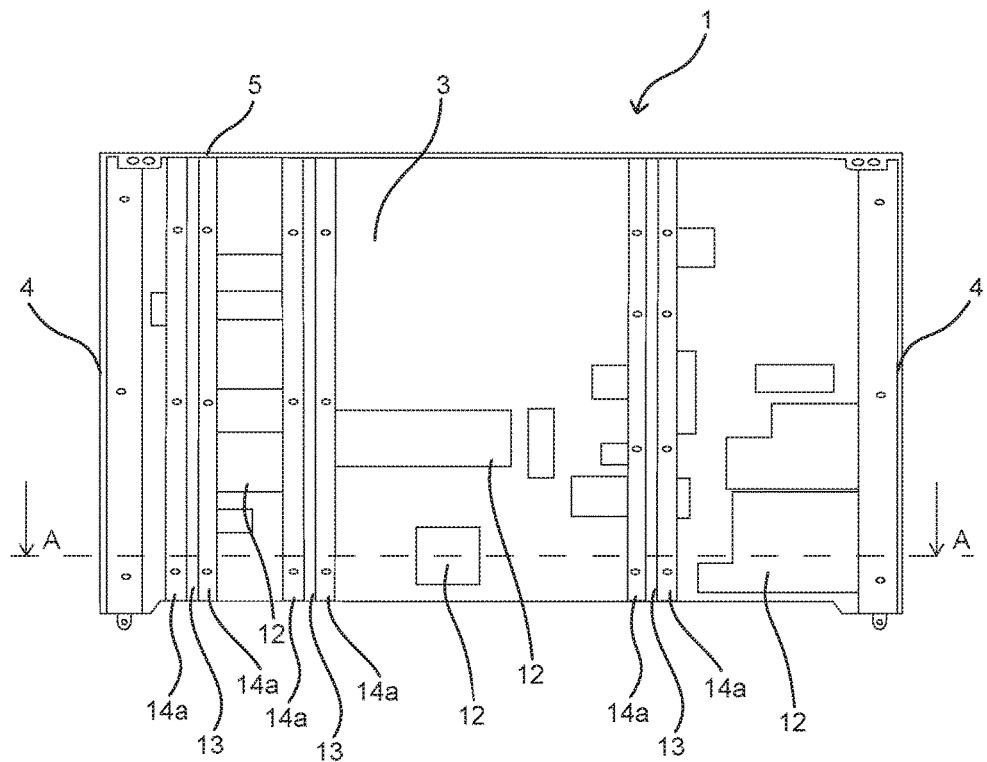
FIG. 4A illustrates a schematic plan view of a housing part.
Figure 4B:
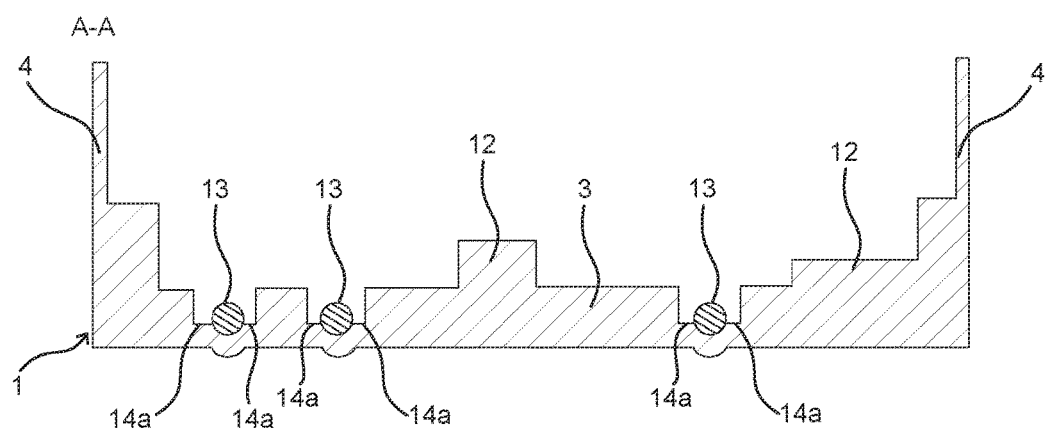
FIG. 4B illustrates a schematic sectional view of the housing part.

FIG. 4A illustrates schematically a plan view of a housing part 1. FIG. 4B illustrates schematically a sectional view through the housing part according to FIG. 4A in relation to the sectional line A-A. The circuit board L that is received by the housing part 1 is not illustrated in the two figures. Multiple solid metal bodies 12 are located on the inner side of the base plate 3 so as to absorb heat from components (not illustrated) that are provided on a circuit board L that is received in the housing part 1. In each case, a heat pipe 13 is arranged in three longitudinal depressions 14a on the inner side of the base plate 3. The three heat pipes 13 dissipate in each case heat to a further outer-lying base plate (not illustrated). The solid metal bodies 12 are expediently arranged in each case in the vicinity of one of the heat pipes 13.

FIG. 5A illustrates a perspective view of a cover 14b. The cover 14b is embodied for the purpose of being inserted into one of the depressions 14a in the base plate 3, said depressions being illustrated in FIG. 4A or B, and to include the heat pipe 13 that is received in the depression 14a in the base plate 3. As a consequence, a particularly effective thermal contact is produced between the heat pipe 13 and the base plate 3. FIG. 5B illustrates a schematic section of a housing part 1 having an inserted cover 14b. FIG. 5B uses a three-dimensional view without a perspective distortion. The cover 14b also comprises solid metal bodies 12 that complement the solid metal bodies 12 that are arranged on the inner side of the base plate 3. It is thereby possible to also guide solid metal bodies 12 onto parts of components that are located in the immediate vicinity of the heat pipe 13 that is covered by the cover 14b. Furthermore, the solid metal bodies 12 are consequently in direct thermal contact with the heat pipe 13. In other words, it is possible by means of providing such a cover 14b to dissipate the heat in a particularly effective manner by means of the heat pipe 13.

FIG. 6 illustrates a perspective view of a third modular assembly that comprises a closing housing 15. The closing housing 15 is attached to a front side on the housing parts 1, said front side lying opposite the complete rear wall 8. The third modular assembly differs from the second modular assembly by virtue of the closing housing 15 that is connected to said third modular assembly. Furthermore, ribs 9b are provided in the case of the outer-lying housing parts 1 in lieu of studs 9a. The ribs 9b also cause an enlargement of the effective surface and as a consequence improve the dissipation of heat to the environment.

FIGS. 7 A-D illustrate schematically the third modular assembly. The third modular assembly comprises four housing parts 1 that are stacked in the same manner as the four housing parts 1 of the second modular assembly. FIG. 7A illustrates a sectional view in relation to the sectional line A-A that is shown in FIG. 7B. FIG. 7A in particular illustrates the circuit boards L. By way of example, the housing parts 1 and the closing housing 15 are not illustrated. The circuit boards L are in each case received in a housing part 1 but extend additionally into the closing housing 15. The circuit boards L comprise cut-outs 16 in the region of the closing housing 15 or in a transition region between the housing parts 1 and the closing housing 15. Two internal connecting means 17 are provided in the region of the cut-outs 16 and one of said connecting means produces a connection between the lower two circuit boards L and the other produces a connection between all four circuit boards L. The two internal connecting means 17 are in each case a further circuit board that extends in a transverse direction. The internal connecting means 17 are connected by means of first connectors 18 to the circuit boards L. Furthermore, a processor connecting means 10 is provided between the adjacent center circuit boards L for processors (not illustrated) that are present at that location. For this purpose, in each case a plugging element is soldered onto the two circuit boards L in the immediate vicinity of one of the processors. The two plugging elements are plugged directly into one another so as to form the processor connecting means 10. The circuit boards L are furthermore connected to second connectors 19. The second connectors 19 are by way of example sockets that are available on an outer side of the closing housing 15 for plugging in the plugs. The second connectors 19 are located by way of example on a front wall of the closing housing 15, said front wall lying opposite the complete rear wall 8. It is possible by means of the second connectors 19 to connect external devices and/or a current supply.

FIGS. 7B, 7C and 7D illustrate various embodiment possibilities of a circuit board L that is provided in the third modular assembly. FIG. 7B illustrates a circuit board L in a sectional view in relation to the sectional line B-B that is shown in FIG. 7A. The circuit board L that is illustrated in FIG. 7B is connected in each case by means of a first connector 18 to each of the two internal connecting means 17. Only one of the two internal connecting means 17 engages within the cut-out 16 through the circuit board L. The reference numeral 20 refers to a current supply unit that is received on two sides in the closing housing 15. The circuit board L comprises a narrower section in this region. The circuit board L is connected to the current supply unit 20 by way of a cable connection that is not illustrated. The section of the circuit board L that is located within the closing housing 15 comprises surge protecting means.

FIG. 7C illustrates a circuit board L to which an expansion plate E is attached by way of two plug connections 21. The circuit board L is located in the region of the housing parts 1. The expansion plate E is located in the region of the closing housing 15. The arrangement of the circuit board and expansion plate E can be provided in the third modular assembly in lieu of the circuit board L that is illustrated in FIG. 7B. The expansion plate E comprises an indentation 22 for the circuit board L so that a recess 23 is formed between the expansion plate E and the circuit board L. One of the two internal connecting means 17 is connected by way of a first connection 18 on the circuit board L. The other of the two integral connecting means 17 is connected by way of a first connection 18 to the expansion plate E. Only the internal connecting means 17 that is connected to the expansion plate E engages through the recess 23 between the circuit board L and the expansion plate E. A current supply unit 20 is received on two sides in the closing housing 15. The expansion plate E comprises for this purpose a corresponding narrower section and is connected to the current supply unit 20 by way of a cable connection (not illustrated). The expansion plate E comprises surge protecting means. The circuit board L can comprise one or multiple interfaces and/or one or multiple processors.

As already illustrated in FIG. 7C, FIG. 7D illustrates a circuit board L to which an expansion plate E has been attached by way of two plug connections 21. Unlike the embodiment in FIG. 7C, the expansion plate E is not connected to an internal connecting means 17. The expansion plate E in FIG. 7D comprises instead two third connectors 24 that in the form of plugging places or plugging strips lead to an outer side of the closing housing 15. An external connecting means 25 is connected by way of one of the third connectors 24 to the expansion plate E. The external connecting means 25 connects the expansion plate E to at least one further expansion plate E and/or at least one circuit board L. The current supply unit 20 is connected to the expansion plate E by way of the other of the two third connectors 24. The expansion plate E comprises surge protecting means. The circuit board L can comprise one or multiple interfaces and/or one or multiple processors.

FIG. 8 illustrates a schematic perspective view into the third modular assembly. For this purpose, in particular the housing parts 1 and the closing housing 15 are not illustrated.

Figure 9B:
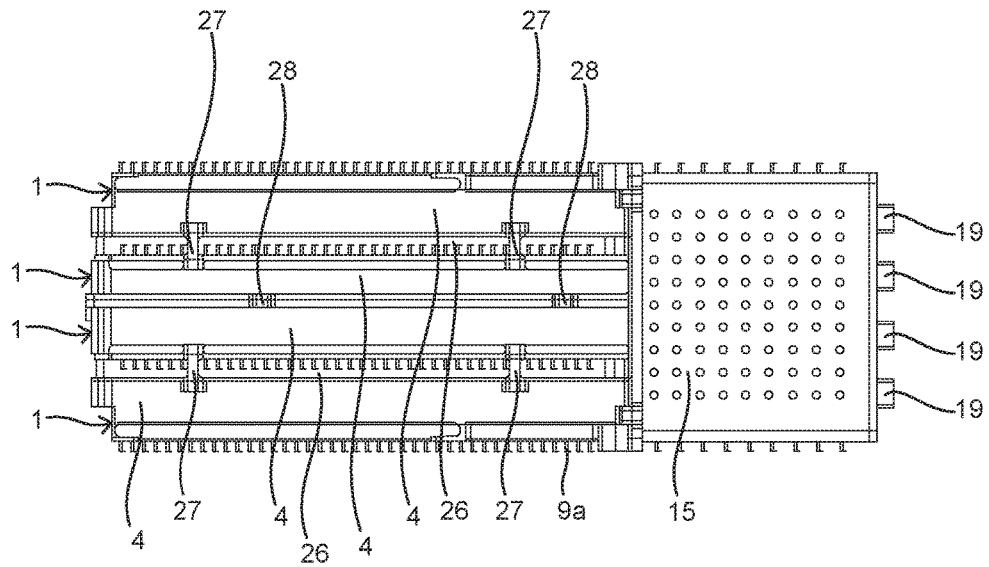

FIG. 9A illustrates a perspective side view of a fourth modular assembly. The fourth modular assembly comprises a closing housing 15 and four housing parts 1 that are stacked in the same manner as the four housing parts 1 of the second and the third modular assembly. FIG. 9B illustrates a side view of the fourth modular assembly. Second connectors 19, by way of example sockets, that are connected to the circuit boards L are provided on a front wall of the closing housing 15, said front wall lying opposite the complete rear wall 8. In the illustrated example, each circuit board L is allocated in each case four double sockets. The side walls 4 of the two outer-lying housing parts 1 comprise in each case one opening 26. In each case a ventilating duct through the two outer-lying housing parts 1 is embodied by means of providing the openings 26. It is possible for air to flow through such an air duct along the outer surface of the base plate 3 of one of the inner-lying housing parts 1. As a consequence, it is possible to dissipate heat that is discharged by one of the inner-lying circuit boards L to the base plate 3 of the inner-lying housing part 1. The outer surface of the base plates 3 comprises a plurality of studs 9a. By virtue of providing the studs, the contact surface between the air and the base plate 3 is increased in size. As a consequence, a particularly effective transfer of heat is achieved from the base plate 3 to the air. In the case of the fourth modular assembly, particularly wide mechanical connections to the housing parts 1 are provided so that the stability of the modular assembly is not weakened despite providing the openings 29. By way of example, the outer-lying housing part 1 is fastened by way of multiple spacers 27 in each case to the inner-lying housing part 1. The spacers 27 extend for this purpose from the side walls 4 of the outer-lying housing part 1 and are fastened to a holding apparatus using fastening means, by way of example a screw, said holding apparatus being provided on the base plate 3 of the inner-lying housing part 1. Further spacers can also be provided on the rear wall 5 of the outer-lying housing part 1. Moreover, in each case connecting means 28 that are arranged in a corresponding manner with respect to one another are attached to the side walls 4 of the two inner-lying housing parts 1. The two inner-lying housing parts 1 can be fixedly connected to one another by means of the connecting means 28. The connecting means 28 can be fixedly connected for this purpose by way of example in each case by means of a screw. The illustrated exemplary embodiment is based on a passive cooling arrangement and accordingly does not comprise an additional ventilating device. Expediently, the fourth modular assembly is orientated in such a manner that the ventilating ducts extend in a vertical direction. In such an orientation, the chimney effect supports the ventilation procedure. In the case of the fourth modular assembly, it is possible by means of providing the ventilating ducts to omit heat pipes 13.

FIG. 10 illustrates schematically sectional illustrations of multiple exemplary embodiments in accordance with the invention. FIG. 10A illustrates schematically the first modular assembly. Two housing parts 1 are stacked in an identical orientation in a stack. A cover plate 2 that is parallel to the base plates 3 closes the stack. A circuit board L is received in each case in the two housing parts 1. The two circuit boards L are connected to one another by means of an internal connecting means 17. The side walls 4 form a first 6 and a second complete side wall 7. Three heat pipes 13 lead from the inner-lying base plate 3 to the outer-lying base plate 3.

Figure 10A:
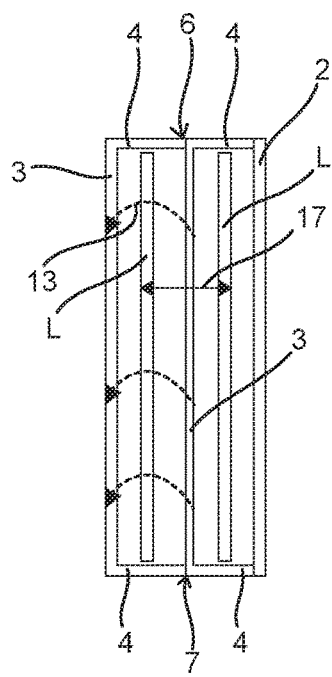
Figure 10B:
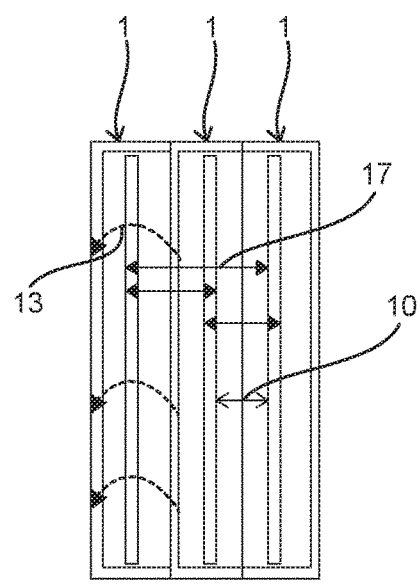

FIG. 10B illustrates schematically a fifth modular assembly. In the case of the fifth modular assembly, the cover plate 2 of the first modular assembly is replaced by means of a further housing part 1 that is stacked on the two housing parts 1 of the first modular assembly and orientated in the opposite manner in comparison thereto. A further circuit board L is received in the further housing part 1. The further circuit board L is connected by means of the internal connecting means 17 and/or by means of one or multiple further internal connecting means 17 to the two circuit boards L that are already provided in the first modular assembly. Moreover, a processor that is provided on the further circuit board L is connected by way of a processor connecting means 10 to a processor that is provided on the circuit board L that is directly facing said processor.

Figure 10C:
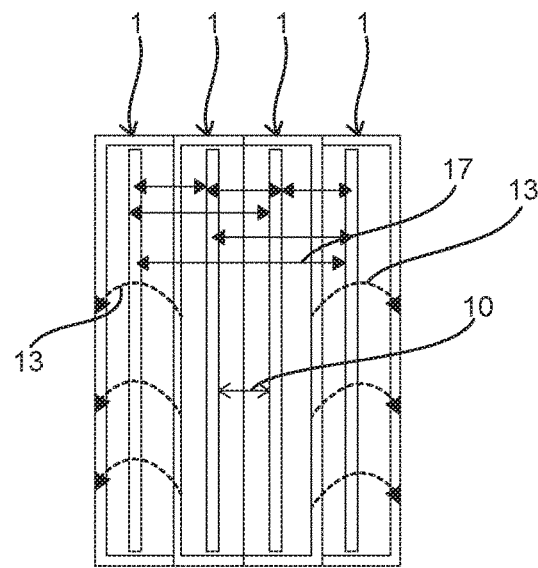

FIG. 10C illustrates schematically the second and third modular assembly. The second and third modular assembly comprises a fourth housing part 1 in addition to the fifth modular assembly that is illustrated in FIG. 10B and said fourth housing part is stacked on the further housing part 1 of the fifth modular assembly in an orientation that coincides with that of said further housing part. Three further heat pipes 13 lead from the base plate 3 that is encompassed by the further housing part 1 to the base plate 3 of the fourth housing part 1. The circuit board L that is received in the fourth housing part 1 is connected by means of the internal connecting means 17 and/or by means of one or multiple further internal connecting means 17 to the circuit board L that is already provided in the fifth modular assembly. The fourth modular assembly, in contrast with FIG. 10C, does not comprise heat pipes.

Figure 10D:
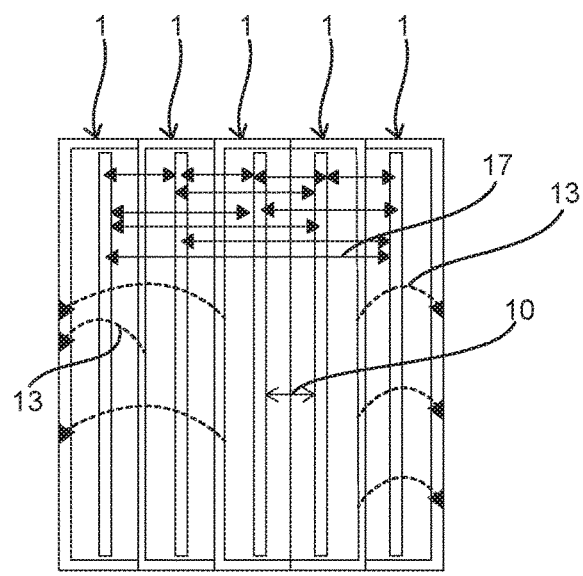

FIG. 10D illustrates schematically a sixth modular assembly. In addition to the exemplary embodiments that are illustrated in FIG. 10C, the sixth modular assembly comprises an additional outer-lying housing part 1 that is stacked on one of the outer-lying housing parts 1 in FIG. 10C in an orientation that coincides with said housing part. In each case, two heat pipes 13 are guided from the base plates 3 of the two further inner-lying housing parts 1 to the additional outer-lying housing parts 1. Alternatively, heat pipes 13 are not provided between the base plates 3 of the two further inner-lying housing parts 1. The circuit board L that is received in the additional outer-lying housing part is connected by means of the internal connecting means 17 and/or by means of one or multiple further internal connecting means 17 to the circuit boards L that are provided in the exemplary embodiments that have already been illustrated in FIG. 10C.

It is clear from FIGS. 10B to 10D that a modular assembly in accordance with the invention can be expanded by one or multiple housing parts 1. The invention comprises therefore in particular also modular assemblies that are produced in accordance with the construction principle evident in FIGS. 10B to 10D and comprise six, seven or more housing parts 1.

LIST OF REFERENCE NUMERALS

1 Housing part
2 Cover plate
3 Base plate
4 Side walls
5 Rear wall
6 First complete side wall
7 Second complete side wall
8 Complete rear wall
9a Studs
9b Ribs
10 Processor connecting means
11 Stepping arrangement
12 Solid metal bodies
13 Heat pipe
14a Depression
14b Cover
15 Closing housing
16 Cut-out
17 Internal connecting means
18 First connector
19 Second connector
20 Current supply unit
21 Plug connection
22 Indentation
23 Recess
24 Third connector
25 External connecting means
26 Opening
27 Spacer
28 Connecting means
L Circuit board
E Expansion plate

The invention claimed is:

1. A modular assembly, comprising at least two housing parts in which in each housing part a circuit board (L) is received, at least one internal connecting means, a cover element and a closing element, wherein each housing part is formed from a base plate, a rear wall and side walls that are connected to said rear wall, wherein the housing parts are stacked in such a manner that the side walls combine to form a first and a second complete side wall and that the rear walls combine to form a complete rear wall, wherein at least two of the housing parts are stacked in such a manner that the base plate of the one housing part is connected to the side walls of the other housing part, wherein the at least one internal connecting means extends in a direction perpendicular to the base plates and connects multiple circuit boards (L) by way of first connectors, wherein the cover element lies on the side walls precisely of a housing part, and wherein the closing element is a closing housing and is attached to a front side of the housing parts, said front side lying opposite the complete rear wall, and wherein an expansion plate (E) is attached to at least one circuit board (L), said expansion plate being located in the closing housing, and wherein a recess is provided between the circuit board (L) and the expansion plate (E) for feeding through at least one of the internal connecting means, wherein the at least one of the internal connecting means is connected by way of first connectors (18) to multiple circuit boards (L) or to multiple expansion plates (E) or to both at least one circuit board (L) as well as at least one expansion plate (E).

2. The modular assembly as claimed in claim 1, wherein the cover element is a cover plate that is essentially parallel to the base plates.

3. The modular assembly as claimed in claim 1, wherein the cover element lies on the precisely one housing part which is stacked in such a manner that the side walls of the precisely one housing part lie on the side walls of the other housing part without one of the base plates of these two housing parts being located between said housing parts.

4. The modular assembly as claimed in claim 3, wherein the circuit board (L) that is received in the precisely one housing part and the circuit board (L) that is received in the other housing part in each circuit board comprise at least one processor and are connected directly to one another by means of at least one processor connecting means.

5. The modular assembly as claimed in claim 1, wherein at least one base plate is thermally connected by means of at least one heat pipe to a further base plate.

6. The modular assembly as claimed in claim 1, wherein the side walls of at least one housing part comprise openings for forming at least one ventilating duct.

7. The modular assembly as claimed in claim 1, wherein the housing parts are produced from metal.

8. The modular assembly as claimed in claim 1, wherein at least one circuit board (L) extends into the closing housing.

9. The modular assembly as claimed in claim 1, wherein the outer side of the closing housing further comprises a set of second connectors for external connections.

10. The modular assembly as claimed in claim 9, further comprising third connectors for at least one external connecting means between said multiple circuit boards (L) or multiple expansion plates (E) or both at least one circuit board (L) as well as at least one expansion plate (E).

11. The modular assembly as claimed in claim 10, wherein the internal and/or external connecting means are achieved by means of cables, further circuit boards and/or optical connections.

12. The modular assembly as claimed in claim 10, wherein the internal and/or external connecting means transfer signals and/or current.

\* \* \* \* \*